US006983026B2

(12) United States Patent
Pinckley et al.

(10) Patent No.: US 6,983,026 B2
(45) Date of Patent: *Jan. 3, 2006

(54) METHOD AND APPARATUS USING BASE BAND TRANSFORMATION TO IMPROVE TRANSMITTER PERFORMANCE

(75) Inventors: Danny Thomas Pinckley, Arlington, TX (US); Sean Michael McBeath, Keller, TX (US)

(73) Assignee: Motorola, Inc., Schaumburg, IL (US)

( * ) Notice: Subject to any disclaimer, the term of this patent is extended or adjusted under 35 U.S.C. 154(b) by 701 days.

This patent is subject to a terminal disclaimer.

(21) Appl. No.: 10/101,903

(22) Filed: Mar. 19, 2002

(65) Prior Publication Data

US 2003/0179829 A1 Sep. 25, 2003

(51) Int. Cl.
*H04L 25/03* (2006.01)
(52) U.S. Cl. .................................................. 375/296
(58) Field of Classification Search ........ 375/295–297, 375/146.14, 130; 455/114.3; 398/193; 370/321, 370/335, 336, 342, 344, 347, 441, 442; 332/123–128
See application file for complete search history.

(56) References Cited

U.S. PATENT DOCUMENTS

| 5,287,387 | A | | 2/1994 | Birchler et al. ............... 375/60 |
|---|---|---|---|---|
| 5,638,403 | A | | 6/1997 | Birchler et al. ............. 375/296 |
| 5,732,333 | A | * | 3/1998 | Cox et al. ................... 455/126 |
| 5,818,298 | A | | 10/1998 | Dent et al. ..................... 335/10 |
| 5,862,457 | A | | 1/1999 | Winters ....................... 455/103 |
| 5,886,573 | A | | 3/1999 | Kolanek ....................... 350/10 |
| 5,920,808 | A | * | 7/1999 | Jones et al. ............... 455/127.1 |
| 6,128,351 | A | * | 10/2000 | Jones et al. .................. 375/284 |
| 6,236,837 | B1 | | 5/2001 | Midya .......................... 455/63 |
| 6,304,140 | B1 | | 10/2001 | Thron et al. ................ 330/149 |
| 6,381,212 | B1 | * | 4/2002 | Larkin ......................... 370/210 |
| 2002/0118767 | A1 | * | 8/2002 | Ylamurto .................... 375/261 |

* cited by examiner

*Primary Examiner*—Tesfaldet Bocure
(74) *Attorney, Agent, or Firm*—Charles W. Bethards; Kevin D. Wills

(57) ABSTRACT

An apparatus for processing base band signals and method thereof to provide low level signals for amplification that will improve performance of a multi-channel transmitter. The apparatus includes a first Transform Matrix (TM) coupled to one or more input signals; a processing unit coupled to the output signals for modifying according to a predetermined algorithm each of the output signals to provide modified output signals; a second TM coupled to the modified output signals for decomposing the modified signals, each of the output base band signals corresponding to one of the input signals; and a compensation function arranged and inter-coupled to either the modified output signals or the output base band signals. The transmitter further converts the output base band signals to radio frequency signals. A sampler couples either the amplifier input signal or output signal back to the compensation function as a feedback signal.

33 Claims, 6 Drawing Sheets

TRACE 1 PAR @ 0.01% = 9.75dB
TRACE 2 PAR @ 0.01% = 4.57dB
TRACE 3 PAR @ 0.01% = 5.62dB
TRACE 4 PAR @ 0.01% = 4.66dB

METHOD AND APPARATUS USING BASE BAND TRANSFORMATION TO IMPROVE TRANSMITTER PERFORMANCE

FIELD OF THE INVENTION

This invention relates in general to communication systems, and more specifically to a method and apparatus that uses base band transformations to improve transmitter performance.

BACKGROUND OF THE INVENTION

Communications systems and particularly wireless communications systems require transmitters in one form or another. Transmitters and particularly higher power transmitters, specifically power amplifiers (PAs), are one of the more expensive and more highly stressed, from a power perspective, components of a communications system. By virtue of the PAs relatively intimate coupling to an antenna system they are subject to abuse due, for example, to antenna irregularities, such as mismatches and weather or lightning events. For these reasons transmitters or power amplifiers are subject to or often experience relatively higher failure rates than some system components. These higher power transmitters are typically found in base stations. Base stations, such as those found in cellular or like communications system are a key link in providing satisfactory service for hundreds and possibly thousands of customers.

Therefore carriers or service providers or network operators cannot afford to have a transmitter failure and will go to great lengths to avoid failures or at least service outages when there is a failure. Hence most base station suppliers utilize some form of redundancy for power amplifiers within the base stations they provide to the marketplace. More recently some manufacturers have been using radio frequency Fourier Transform Matrices (FTMs) to provide this redundancy. FTMs combine phase shifted versions of input signals to provide multiple output signals which are then amplified and passed through another radio frequency FTM to decompose the amplified signals into amplified versions of the original input signals. Thus if a PA fails, the remaining PAs will continue to amplify the input signals and provide amplified signals thus avoiding service outages. This may be more economical than having full redundancy for each power amplifier. However, there is still a problem.

Many communications systems today require linear PAs because they rely on complex modulation schemes that specify amplitude and phase variations in the transmitted radio signals. Even systems that do not per se require linear PAs, but use FTMs, will find amplitude variations in the combined phase shifted signals that are to be amplified and thus need linear PAs. Linear PAs are very difficult and expensive to construct. Limiting the range of output, thus input, signals over which the amplifier must demonstrate a degree of linearity can control or contain costs and difficulties. In conventional amplifier systems there are known techniques for processing the input signals to assist with these goals, however there are no known techniques that work when FTMs are employed. What is needed is a method and apparatus for processing base band signals using transformations thereof to improve performance of transmitters, specifically multi-channel transmitters using FTMs.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF PREFERRED EMBODIMENT

In overview form the present disclosure concerns communications systems that utilize transmitters to provide service to communications units or more specifically user thereof operating therein. More particularly various inventive concepts and principles embodied in methods and apparatus for the use of base band transformation in order to improve performance of multi-channel amplifiers employing analog Fourier Transform Matrices for load sharing and redundancy are discussed and disclosed. The communications systems of particular interest are those being deployed and developed such as GSM, GPRS, CDMA, IDEN, 2.5G, and 3G systems that use modulation formats such as QPSK, DQPSK, OQPSK, BPSK, QAM, and spread spectrum or variations and evolutions thereof that require cost effective high availability linear transmitters.

As further discussed below various inventive principles and combinations thereof are advantageously employed to essentially construct and process at base band the signals that the amplifiers will encounter, thus alleviating various problems associated with known systems while still facilitating cost effective, high performance and high availability transmitters provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in software programs or instructions and integrated circuits (ICs) such as application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore further discussion of such software and ICs, if any, will be limited to the essentials with respect to the principles and concepts of the preferred embodiments, in the interest of brevity and minimization of any risk of obscuring the principles and concepts in accordance with the present invention.

Figure 1:
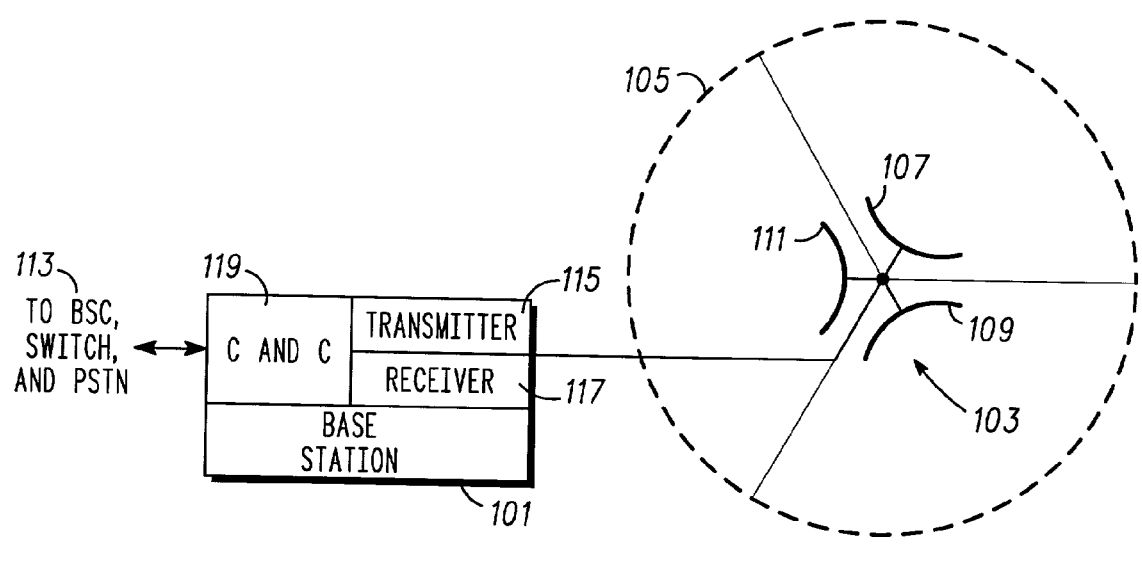
FIG. 1 depicts a simplified diagram of a portion of a communications system suitable for employing an embodiment according to the present invention.

Referring to FIG. 1 a simplified diagram of a portion 100 of a communications system will be described. FIG. 1 shows a base station 101 inter-coupled to an antenna system 103 to provide coverage to users within the general coverage area 105. The antenna system 103, depicted, is a sector gain system with 3 sectors 107, 109, 111 depicted, each covering, nominally, 120 degrees, although other arrangements such as 6 sectors, or multiple antennas forming an array within a coverage area, etc. would be appropriate. Ordinarily the base station will supply entirely different signals to each sector of the antenna and possibly multiple signals to one or more of the sectors. Even when an omni directional antenna is used the station will often need to supply multiple signals to the omni directional structure. In any event the base station is further coupled at 113 to a base site controller and switch and eventually the Public Switched Telephone System typically via a dedicated link such as a T1 terrestrial link or the like.

Essentially the base station handles the radio links to and from subscriber devices or users of portable or mobile equipment and the land or terrestrial based portions of the systems or networks. Generally the base stations can be thought of as including and inter-coupled a communications and control function 119, a receiver function 117 and a transmitter function 115. Each of these functions can be quite complex in its own right and comprise a redundant system. The receiver and transmitter functions or blocks will inevitably include tens of receivers and transmitters. These stations and antenna systems are generally known and available from multiple suppliers, such as Motorola, etc., and when the transmitters are modified and constructed according to the principles and concepts disclosed herein improved performance and cost advantages can be realized.

Figure 2:
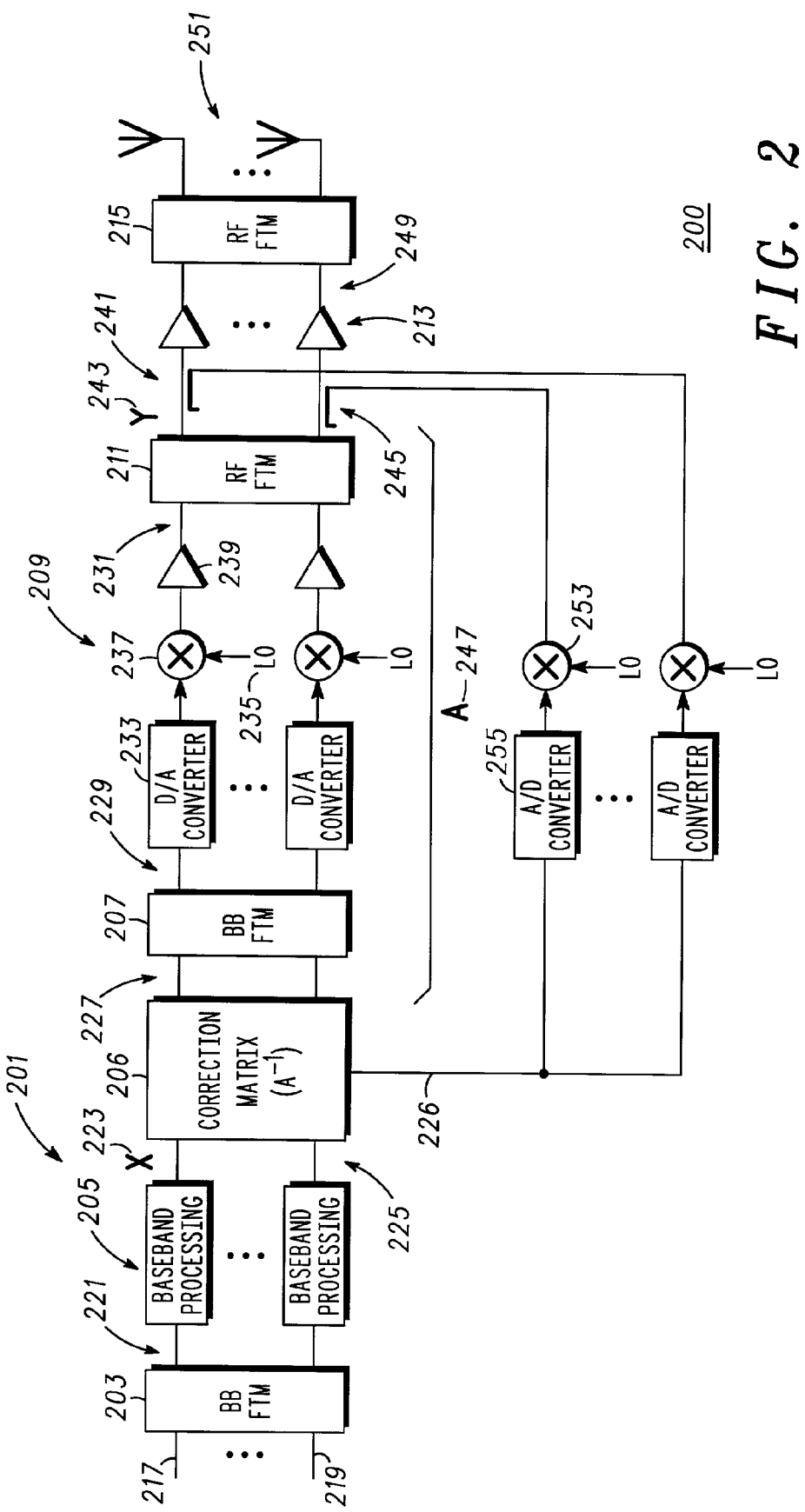
FIG. 2 depicts a simplified block diagram of a preferred embodiment of a transmitter according to the present invention.

Referring to FIG. 2, a simplified block diagram of a preferred embodiment of a transmitter 200 will now be discussed and described. The FIG. 2 transmitter is a multi-channel transmitter using FTMs for power amplifier redundancy and having improved performance by virtue of reduced peak power requirements or pre-distorted input signals or the like all resulting from the use of base band transformations to provide suitable signals for driving the amplifiers within the transmitter. Multi-channel transmitter is used to describe a transmitter having multiple parallel paths and amplifier stages such as may be encountered or may be particularly well suited for amplifying signals produced by a Transform Matrix (TM) or for driving a TM, each preferably an analog or radio frequency matrix, such as a Fourier TM (FTM) or a Butler Matrix. Generally the improved performance results from either reduced peak power requirement, accomplished by limiting the peak to average ratios (PARs) of base band signals that in turn produce the signals that are presented to the amplifiers, then amplified, and thus the amplified signals, or from pre-distortion of the base band signals in order to provide an input signal to the amplifiers that offsets undesired results from the amplifier, or conceivably other base band processing techniques. One additional element of the base band processing is a compensation function that compensates the base band signals to account for variability in various signal paths to the amplifiers or through the transmitters. The processing is done at base band but rather than processing the input signals as is traditional they are first passed through a base band TM, processed, and passed through a second base band TM, each preferably a digital base band FTM.

The multi-channel transmitter using analog Fourier Transform Matrices for power amplifier redundancy and having improved performance includes an apparatus 201 for processing base band signals to provide appropriate low level signals for driving the amplifier stages of the multi-channel transmitter. This apparatus includes a Transform Matrix (TM), preferably a digital Fourier TM (FTM) 203 that is coupled to at least one input signals and from there coupled to a processing unit 205 that performs base band processing to provide modified signals to a second TM, preferably a second FTM 207 that is the inverse of the FTM 203 that decomposes the peak limited output signals to provide output base band signals to a mixer 209. The mixer 209 converts these base band signals to radio frequency signals that are coupled to a first analog or RF FTM 211 that provides amplifier input signals comprising combinations of phase shifted versions of the radio frequency signals. These amplifier input signals are amplified by an amplifier 213 and then the amplified output signals are decomposed or perhaps more accurately re-composed at or by a radio frequency or second analog FTM 215 to provide transmit signals 251 for driving an antenna structure such as 103.

Much or all of the remaining material below will assume that the TMs used at base band and the TMs used at the radio frequency, such as FTM 211, 215 are FTMs as that is a preferred embodiment. However, there are various other forms of TMs that will work equally well. For example, a known Butler Matrix will work equally well. Note that for optimum performance whatever form of TM is chosen for the input and output matrix surrounding the amplifiers 213 will determine the form of matrix that should be used at base band in order to realize the full benefit of the principles and concepts according to the present disclosure. In addition it is important that the base band TM is driven, input for input and therefore produces signals, output for output, that correspond with the way the RF TMs are driven, input for input, and thus transmit signals they produce, output for output.

In any event and in more detail the FTM 203 and FTM 207, preferably are digital FTMs that are implemented in software via a Digital Signal Processor (DSP) or an Application Specific Integrated Circuit (ASIC) or combination thereof. The FTM 203 is coupled to the at least one input signal 217 and preferably a plurality of such signals 217–219 at a plurality of inputs and provides a plurality of output signals or FTM output signals 221, where each of the output signals comprises a combination of phase shifted versions of the one or more input signals and preferably plurality of input signals according to FTM techniques further discussed below. The input signal or signals is preferably a base band signal or signals intended for transmission on one or more radio channels with a channel here being interpreted as one or more carriers intended to provide coverage in or to a particular coverage area.

A typical example would be a plurality of input signals each comprising a code division, time division, or frequency division multiple access base band signal intended for transmission, on one or more carrier frequencies, within one sector of a plurality of sectors, such as 107, 109, or 111. Note that FTMs may have more available inputs than available input signals. In that instance the remaining or extra inputs are simply terminated with the appropriate impedance. In this case the output FTM will have more outputs that output signals and again the extra outputs are terminated. For example it is common to use 4×4 matrices, implying four inputs and four outputs. In this case if the transmitter was driving a three-sector antenna system such as 103 one input and one output of each FTM in the lineup would be terminated with the other three coupled to or providing actual signals.

Although a CDMA lineup may be typical the principles and concepts herein discussed will have application and be equally advantageous, regardless of the particular form of modulation and channel access employed provided of course that the modulation can withstand or to the extent that the modulation can withstand the distortion that results from the base band processing, such as peak limiting or pre-distortion. For example, besides CDMA the modulation and access methodologies, such as TDMA or FDMA, thus base band signals, used variously for GSM, GPRS, EDGE, TETRA, iDEN, CDMA, W-CDMA, CDMA2000, 2.5G, or 3G will work equally well.

The apparatus 201 and specifically processing unit 205 further includes a plurality of base band processing functions that are each coupled to one of the plurality of output signals 221. The processing unit operates to process and modify according to a predetermined algorithm each of the output signals from the FTM 203 in a manner that makes them more compatible with or less demanding on a linear power amplifier. Examples of such processing, include limiting a peak value or all peak values for each of the plurality of FTM output signals or pre-distorting the plurality of output signals using predetermined algorithms to provide a plurality of modified output signals 225.

As will be discussed in more detail below, with reference to FIGS. 3–6, a preferred approach for limiting is through the use of a clipping function that operates to limit peaks of each of the FTM output signals. Preferably this clipping function is a so called windowed clipping function that operates to limit peaks according to a predetermined function that lowers the probability that a peak value will exceed a predetermined value for each of the modified output signals 225. It has been shown that further improvement in performance of the amplifiers or transmitter can be realized if the clipping function is followed by a filter that is coupled to an output of the clipping function to reduce undesired signals resulting from the clipping function. Additional improvement has been realized in some instances when the filter is followed by a second clipping function that is coupled to an output of the filter and that operates to further limit peaks of a filtered version of each of the FTM output signals. This is usually considered a light clipper in that only a small percentage of any peak is clipped or limited.

In the example using pre-distortion, the processing unit 205 modifies the output signals using a pre-distortion function that pre-distorts each of the output signals according to a predetermined function that reduces the effects on the transmit signals that result from various nonlinearities of the amplifiers where these nonlinearities are subject to some form of modeling. For example it is known that an amplifiers gain will fall off at higher input signal levels with a transfer curve often resembling an inverse exponential. Thus one can shape or predistort input signals according to an exponential like curve thereby reducing the effects on an output signal due to nonlinearities of an amplifier. This may be referred to as linearization of or linearizing the amplifier. Note that predistortion ordinarily includes phase predistortion as well as amplitude as the phase shift through an amplifier will also change with the magnitude of the input signals.

In any event the modified output signals 225 are, preferably, coupled either directly or through a compensation function 206 and thus the compensated modified output signals 227 to the second FTM 207 that operates to decompose the modified output signals to provide at least one and preferably a plurality of output base band signals 229, each corresponding one for one and respectively to the input signals 219–217, where the reversal in order is a result of the FTM processes. Thus for each input base band signal at FTM 203 there will be one output base band signal at FTM 207.

The compensation function 206, preferably a correction matrix, is arranged and inter-coupled to one of either the plurality of modified output signals as depicted in FIG. 2 or the output base band signals from the second FTM 207 (not shown) and operable to compensate, preferably according to a feedback signal 226, the group of signals that it is coupled to comprising either the plurality of modified output signals or the output base band signals. When the compensation function 206 is inter-coupled between the processing unit 205 and the second FTM 207, as depicted, it is arranged to be operable to compensate the plurality of modified output signals, preferably according to the feedback signal 226, for variations in a plurality of paths between the compensation function and a sampler, discussed below. When the compensation function is coupled to the output base band signals (not shown) and prior to the mixer 209 it is operable to compensate the output base band signals, preferably according to the feedback signal 226, for variations in a plurality of paths between the compensation function, as here coupled, and the sampler. The compensation function can range from a relatively simple situation, such as where gain and phase compensation, fixed or variable via feedback signals, is applied to each of the signals from the one of the plurality of modified output signals and the output base band signals depending on where the compensation is located to relatively complex situations with feedback information and conceivably feed forward information as to type of modulation, symbol rates, base band processing and so on.

In any event the output base band signals are coupled to the mixer 209 where they are converted to a plurality of radio frequency signals 231. As depicted the mixer 209 is comprised of a plurality of mixer lineups each coupled to one of the output base band signals from the second FTM or the compensation function in the alternative arrangement and each providing a corresponding one of the radio frequency signals 231. Referring to the top mixer and recognizing that each is similar, the output base band signal is converted to an analog signal by digital to analog converter 233 followed by appropriate filtering (not specifically shown) and this analog signal and a LO signal 235 are applied to a generally known mixer 237 for up-conversion of the frequency of the analog signal to a radio frequency suitable for transmission and this is followed by a frequency selective gain stage 239 all as generally known and so as to generate and provide radio frequency signal 231. Each of the output base band signals is converted from a base band frequency or bit rate of a megabit or so per second to an analog signal at a transmission radio frequency of, for example, either 800 to 1000 MHz or 1.8 GHz to 2.2 GHz or more.

Further included in the multi-channel transmitter is the first analog FTM 211 which is coupled to the at least one and preferably plurality of radio frequency signals 231 and operable to provide a plurality of amplifier input signals 241, each comprising a combination of phase shifted versions of the one or more radio frequency signals. These are applied to the power amplifier 213 that includes a plurality of amplifiers coupled to the plurality of amplifier input signals 241, each amplifier having an input coupled to one of the amplifier input signals where each of these signals, preferably, corresponds to one of the modified output signals 225. Each amplifier is operable to amplify the amplifier input signal and provide an amplified output signal, wherein the plurality of amplifiers provide a plurality of amplified output signals 249.

Further included in the transmitter is a sampler 245 that is arranged for coupling a plurality of portions of a group comprised of either the plurality of the amplifier input signals 241 (as depicted) or the plurality of the amplified output signals 249 (not shown), each of the portions representative of one of the input or one of the output signals within the one of the plurality of the amplifier input signals 241 and the plurality of the amplified output signals 249, back to the compensation function, where the plurality of portions correspond to the feedback signal. In other words the sampler comprised of lightly coupled strip lines for instance can be located on either the input or output side of the amplifiers or for that matter at the output of the second RF FTM 215 and thus coupled to either the amplifier input signals 241 as shown or the amplified output signals 249, or the transmit signals 251, not shown. Wherever located, these plurality of portions are coupled to mixers 253 and down converted by a Local Oscillator (LO) to base band where they are converted to a digital signal by analog to digital converters 255. These digital signals collectively comprise the feedback signal 226.

Referring again to the compensation function 206, or correction matrix, it may be determined as follows. To do so, consider the system, XA=Y+E, where X is an input matrix 223, and Y is an output matrix 243, A is an unknown matrix 247 and E is the matrix of errors. The matrix A can be found in the least squares sense by solving the system of equations XA=Y+E in order to minimize E. The solution to this system of equations is $A=(X^TX)^{-1}X^TY$. In our example, the output matrix 243 is the output of the first RF FTM 211 (labeled Y in FIG. 2), and the input matrix 223 is the output of the processing unit 205 (labeled X in FIG. 2). The matrix A or unknown matrix 247 is the combination of the second baseband FTM 207, the up-conversion path (233, 237, 239) etc., and the first RF FTM 211(labeled A in FIG. 2). The compensation function 206 or correction matrix (labeled $A^{-1}$ in FIG. 2) compensates for both the frequency response of the up-conversion path and the imbalance in the first RF FTM as the base band FTM 207 contributes little if any error that requires compensation. This compensation function or correction matrix may be found experimentally by actually testing a system using an appropriate test signal. In practice small pilot tones would be an appropriate signal to use for characterizing the various paths.

One last element of the transmitter is the radio frequency or analog FTM 215 that is coupled to the plurality of amplified output signals 249 to provide at least one transmit signal corresponding one to one with the at least one input signal 217 and preferably a plurality of transmit signals for driving a plurality of antennas 251 corresponding one to one and respectively with the input signals 217–219. Basically the analog FTM 215 decomposes the combinations of phase shifted versions of the radio frequency signals that have been amplified back into their respective original content. Note that as signals traverse two FTMs they will also be reversed in order. It is important as is known that the signals applied to the analog or RF FTMs be ordered in the same fashion as the input signals 217 to 219. This, while important to appropriate functioning of the preferred embodiment, is trivial to one of ordinary skill and dealt with by the proper connection of the plurality of mixer 209. Note that the principles and concepts disclosed and described apply to essentially any size matrix and the matrix need not be square as here. Analog FTMs are known and available in various dimensions such as 4×4 matrix from suppliers such as Anaren Microwave. The FTM is a series of hybrid combiners that combines the input signals at specific phase angles. The typical bandwidth for the matrix is 200 MHz with an insertion loss of 0.5 dB.

In any event, as described and discussed the multi-channel transmitter is preferably arranged and constructed for transmitting code division, time division, or frequency division multiple access signals on multiple sectors. The input FTM and output FTM are, preferably, digital FTMs with one or more base band input signals at the input FTM, while the processing unit includes, preferably, a windowed clipping function or pre-distortion function or a combination of both, and the radio frequency FTMs 211, 215 are analog or RF FTMs. In this fashion the base band signals are processed at base band in a form that represents the signals input to the plurality of radio frequency amplifiers in order to limit the demands on the plurality of power amplifiers or provide a pre-distorted signal to the amplifiers that offsets undesired signals created by the amplifiers thus, respectively, reducing the peak power requirements or offsetting undesired results thereby improving performance for the multi-channel amplifier.

Figure 3:
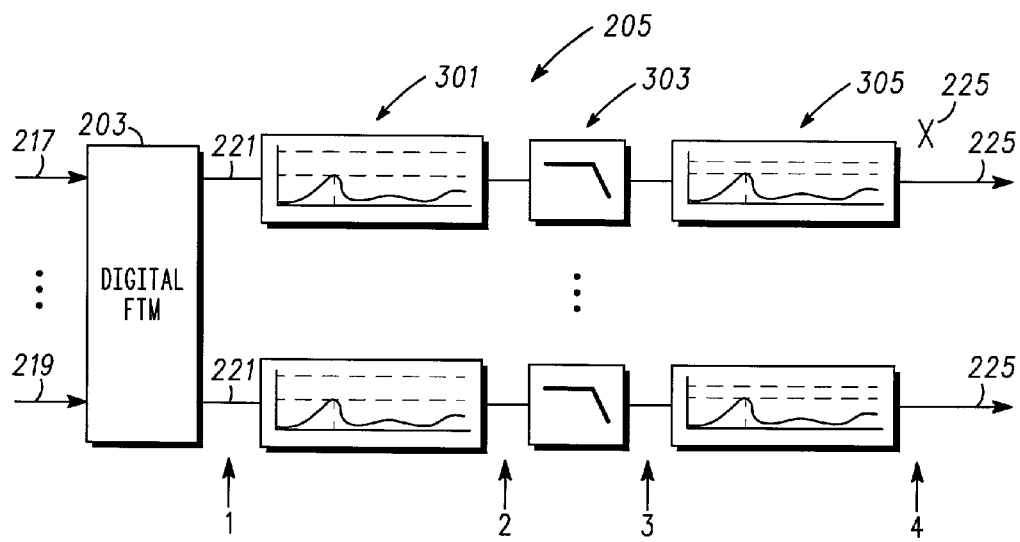
FIG. 3 illustrates a block diagram of an apparatus to reduce peak power requirements suitable for use in the FIG. 2 transmitter in accordance with the present invention.

Referring to FIG. 3, a block diagram of a preferred embodiment of a portion of an apparatus 201 for processing base band signals to provide low level signals for amplification that will improve performance of a multi-channel transmitter and more particularly reduce peak to average ratios or peak power requirements that is suitable for use in the transmitter described above will now be discussed and described. The apparatus depicted and described is largely or substantially all suitable for and preferably implemented in integrated circuit form, for example in an ASIC including a DSP and supporting hardware and the like. Some of this discussion will be in the nature of a review while some will elaborate on various functions and processes described briefly earlier. The apparatus 201 described here reduces peak power requirements of a multi-channel transmitter and it does so by reducing Peak to Average Ratios (PARs) of signals that are representative in amplitude characteristics of the signals that will be applied to each power amplifier in the multi-channel transmitter. This particular embodiment of apparatus 201 may be used together with or in combination with a pre-distortion function such as described above or in lieu thereof. The apparatus includes the Transform Matrix (TM), mentioned above, that is coupled to at least one input signal 217 and preferably a plurality of input signals 217–219. The TM is, preferably a digital FTM 203, for providing a plurality of output signals 221 where each comprises a combination of phase shifted versions of the one or more input signals. Additionally included in the apparatus 201 is the processing unit 205 that is coupled to the plurality of output signals 221 and is operable for modifying according to a predetermined algorithm each of the output signals to provide a plurality of modified output signals. More particularly in the depicted embodiment the processing unit is for limiting peak values for each of the plurality of output signals. The modified output signals are coupled to the inputs of a second TM preferably a second digital FTM 207, (see FIG. 2), that is operable for decomposing the modified output signals 225 to provide a plurality of output base band signals 229 that are suitable for generating a plurality of low level signals, specifically radio frequency signals for driving the analog FTM 211 and thus the multi-channel transmitter, each of the output base band signals corresponding to one of the input signals.

Figure 8:
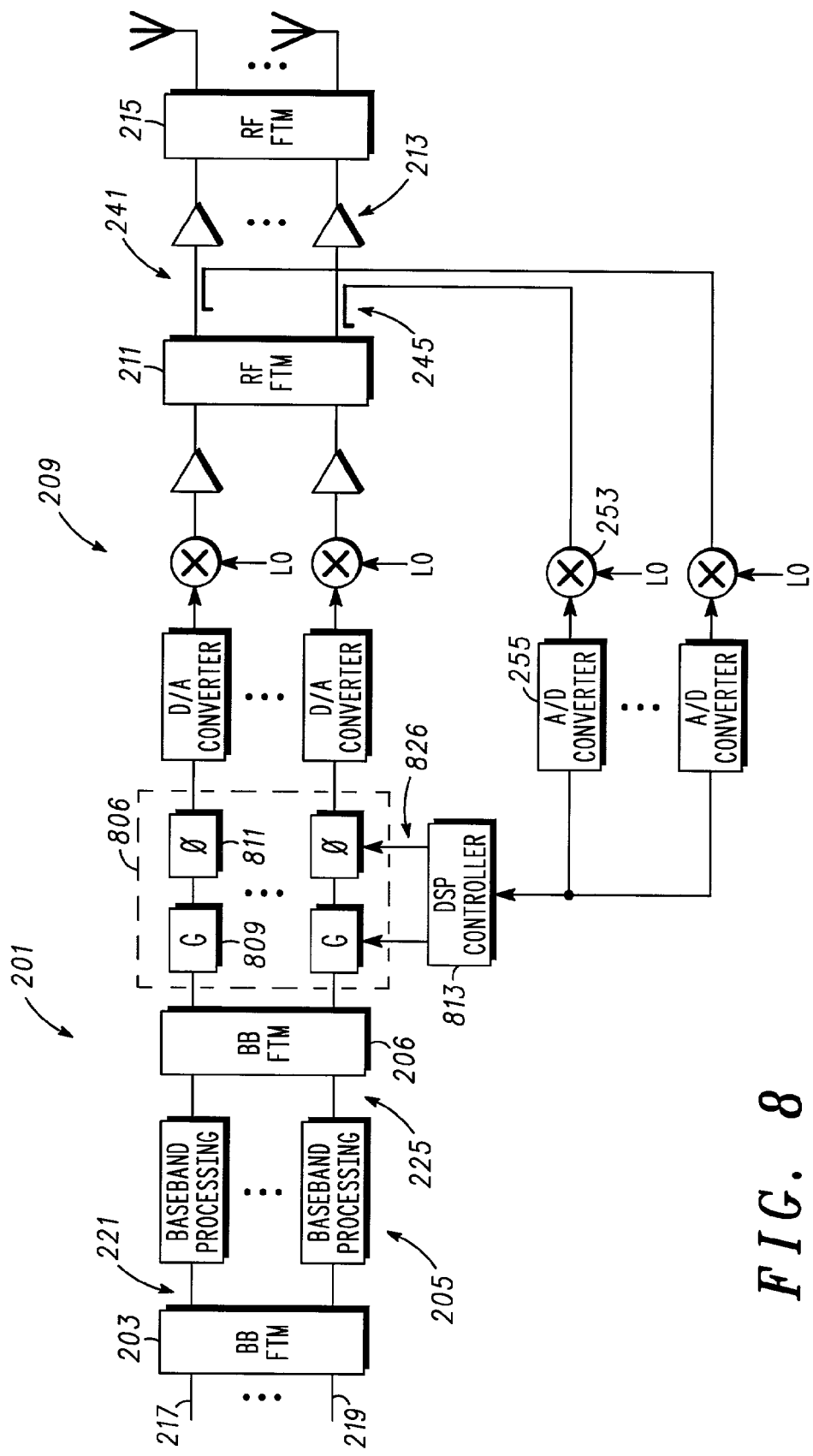
FIG. 8 illustrates alternative embodiment of the FIG. 2 transmitter.

The apparatus also includes a compensation function (not shown) that as noted earlier is arranged and inter-coupled to one of the group comprising the plurality of modified output signals 225 or the output base band signals 229 to compensate the appropriate group of one of the plurality of modified output signals or the output base band signals so that the output base band signals are suitable for generating the low level signals that will improve the performance of the multi-channel transmitter. More specifically the compensation function when inter-coupled between the processing unit and the second TM is operable to compensate the plurality of the modified output signals, preferably according to a feedback signal, for variations in a plurality of paths within the multi-channel transmitter, where the feed back signal originates from the multi-channel transmitter. When coupled to the output base band signals the compensation function compensates those signals for the same reasons in a similar manner. The compensation function in one embodiment discussed briefly below with reference to FIG. 8 is operable to apply gain and phase compensation to either the plurality of modified output signals or the output base band signals.

The apparatus, specifically the digital FTM 203 is preferably coupled to a plurality of input signals each comprising a base band signal, such as a code division, time division, or frequency division multiple access base band signal, intended for transmission on a radio channel such as on one sector of a plurality of sectors or one sector antenna of a multiple sector antenna structure. Note one base band signal for example, IS-95 CDMA, as is known, can include pilot, paging, and sync signals, and as many as 61 voice or data payload signals for each of multiple carriers. A typical bit rate for an IS-95 base band signal is approximately 1.3 M bits per second and other versions of CDMA can go much higher.

As depicted the apparatus or processing unit 205, preferably, includes a clipping function 301 comprising one clipping block or operation for each of the output signals 221, that operate to limit peaks of each of the output signals. This clipping function 301 is preferably a windowed clipping function that operates to perform a relatively heavy clip to limit peaks according to a predetermined function that lowers the probability that peak values will exceed a predetermined value for each of the modified output signals. Following the clipping function is preferably a filter 303 coupled to an output of each of the clipping functions 301 and operating to reduce undesired and higher frequency signals resulting from the clipping function. Following the filter is, preferably, a second clipping function 305 coupled to an output of each of the filters 303 that operates, preferably analogously with clipper 301 however at a much lighter clip level, to further limit peaks of each of the modified output signals 225. Advantageously the apparatus 201 is suitable for implementation in an integrated circuit form as either a DSP or ASIC or combination of both as will be recognized by one of ordinary skill given the principles and concepts disclosed herein.

A 4×4 digital FTM can be described by the following matrix below:

|      | Vout1      | Vout2       | Vout3       | Vout4       |
|------|------------|-------------|-------------|-------------|
| Vin1 | 0.5∠0      | 0.5∠−90     | 0.5∠−90     | 0.5∠−180    |
| Vin2 | 0.5∠−90    | 0.5∠−180    | 0.5∠0       | 0.5∠−90     |
| Vin3 | 0.5∠−90    | 0.5∠0       | 0.5∠−180    | 0.5∠−90     |
| Vin4 | 0.5∠−180   | 0.5∠−90     | 0.5∠−90     | 0.5∠0       |

This can also be represented by the equations:

$Vout1 = 0.5 \cdot Vin1 \angle 0° + 0.5 \cdot Vin2 \angle -90° + 0.5 \cdot Vin3 \angle 90° + 0.5 \cdot Vin4 \angle -180°$ $Vout2 = 0.5 \cdot Vin1 \angle -90° + 0.5 \cdot Vin2 \angle -180° + 0.5 \cdot Vin3 \angle 0° + 0.5 \cdot Vin4 \angle -90°$ $Vout3 = 0.5 \cdot Vin1 \angle -90° + 0.5 \cdot Vin2 \angle 0° + 0.5 \cdot Vin3 \angle -180° + 0.5 \cdot Vin4 \angle -90°$ $Vout4 = 0.5 \cdot Vin1 \angle -180° + 0.5 \cdot Vin2 \angle -90° + 0.5 \cdot Vin3 \angle -90° + 0.5 \cdot Vin4 \angle 0°$ Either the matrix or the equations show the relationship between the output signals Vout and input signals Vin. It turns out to be reasonably straight forward to perform these calculations in a DSP.

Figure 4:
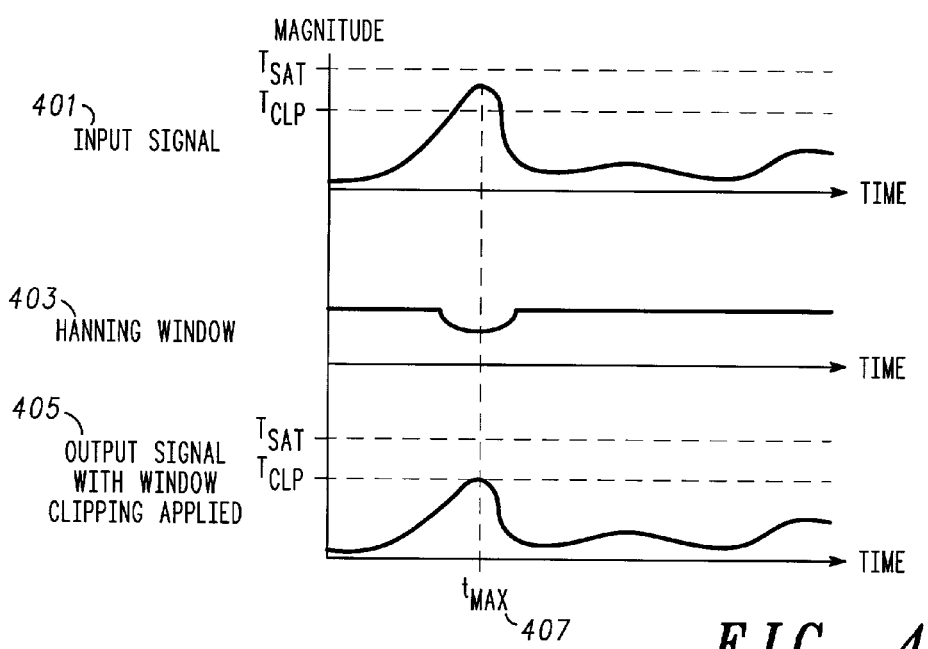
FIG. 4–FIG. 6 depict some operating waveforms and performance graphs of the FIG. 3 apparatus.

The clipping functions will now be described in more detail with reference to FIG. 4. First we will discuss some definitional material to give the reader a better appreciation for the clipping processes. The crest factor of a signal is defined as the ratio of peak power to average power. Although it is useful to know the peak-to-average ratio (PAR) of a signal, the cumulative distribution function (CDF) provides better insight as to the true statistical nature of the envelope power. The CDF and the complementary cumulative distribution function CCDF are defined by the following equations.

$$CDF = F(x) = \int_{-\infty}^{x} f(\xi) d\xi$$

$$CCDF = 1 - F(x)$$

Essentially, the CCDF is a plot of the PARs from 0 to 100%. It is convenient to work in terms of distribution functions since the peak level and the amount of time spent at and above the crest factor is important. Simply stated, the shape of the CCDF is important. For the purposes of this disclosure, crest factor will be defined as the PAR at 0.01%. For example, a 10 dB PAR will imply that there is a 0.01% probability that a signal power will be greater than 10 dB above the average power.

It is desirable that the clipping function limit the peaks of the signal and at the same time generate as little noise or splatter or undesirable signal power as possible. To produce a low splatter clip it is important that the discontinuities in the waveform be minimal. The windowed clipping algorithm is an excellent approach to satisfying these objectives. The clipping is implemented digitally in base band processing so that the data may be processed in non-real time.

Various forms of windowed clipping algorithms will suit the purposes. Referring to FIG. 4 an algorithm is described that uses two thresholds to limit the peaks of the signal 401. The soft clipping threshold is designated as Tclp while the hard clip threshold is called Tsat. The user determines the values of these thresholds experimentally based on a particular system set up. The first step in the window clipping algorithm is to scan the input waveform for peaks that exceed the clip thresholds. Once the peak of a signal exceeding the thresholds has been identified either a hard clip or soft clip will be applied. The peak index in FIG. 4 is designated as $t_{max}$ 407. In the case of a soft clip the peak portion of the waveform is convolved with an inverted Hanning window 403. Various other types of windows will also work properly as those of ordinary skill in the art will realize. The equations below show the Hanning window, $h_j$, the window clipping function, $w_j$, and the window length, L.

$$h_j = [1 - \cos(2\pi j/(L-1))]/2$$

$$w_j(n) = 1 + (c-1) \cdot h_j$$

$$j = 0, 1, 2, \ldots, L-1$$

The window clipping function is calculated such that the peak at $t_{max}$ will be equal to the Tclp level after the window and signal have been convolved and this is shown at 405. Therefore, for any peak that exceeds Tclp but is less than Tsat a custom window will be calculated and applied to reduce the local maximum to the Tclp level. Substituting the following weight into the equation above will calculate the desired window function.

$$c = \overline{T_{CLP}/|Input\_Signal(t_{max})|}$$

There will be some discontinuities around the peak region since only that portion of the signal is being filtered but they should be substantially less than those associated with a hard clip.

At some point one may find that the window clipper is working so hard that it is producing more splatter than a hard clip. If this is the case, then using a constant clipping weight rather than a variable clipping weight will be the best measure. The equation below describes the clipping weight for such a case.

$$c = \overline{T_{CLP}/T_{SAT}}$$

In the case of a hard clip the signal value will be changed to match the Tclp threshold.

The filter 303 was implemented in DSP form to satisfy the following general attributes. The filter should have a flat pass band to preserve the characteristics of any prior channel or pulse shaping filters. In addition a steep transition band and adequate attenuation are needed to ensure that the filtered waveform will meet channel specifications.

Figure 5:
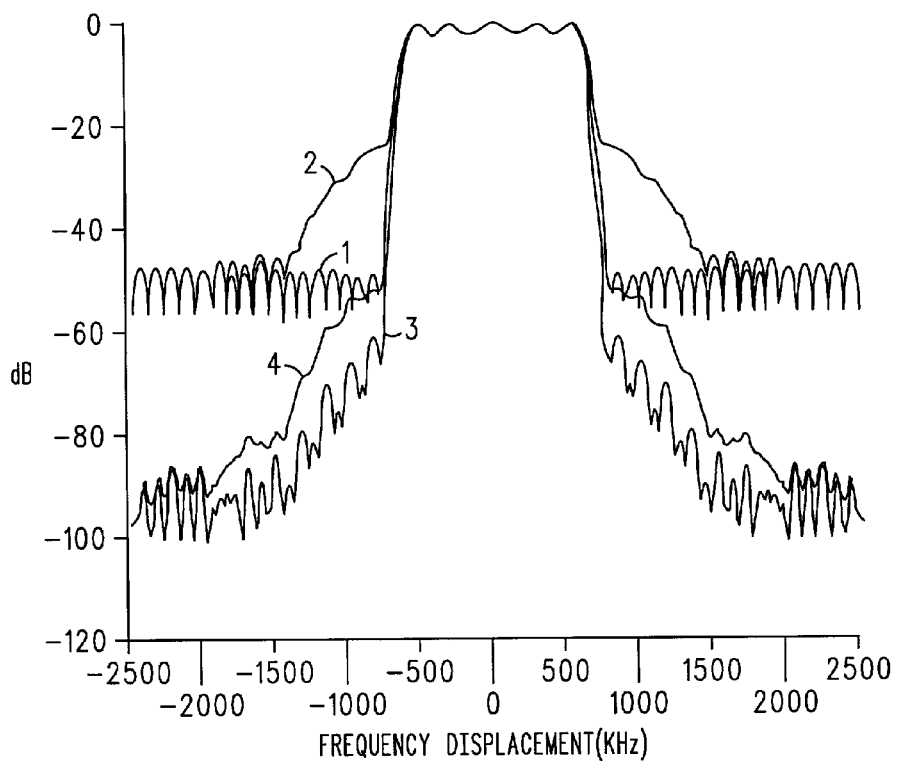

Referring to FIG. 5 the power spectral densities for the points marked 1–4 in FIG. 3 are shown. Recall that in the apparatus 201 of FIG. 3 two clipping functions 301, 305 are employed. The first clipping function's threshold value is set to a low level to produce a heavy clip. The output of the first clipper is filtered to eliminate the splatter that is generated from the heavy clipping function. After filtering, the resultant signal is clipped again. The second clipping function's threshold is set to clip the signal very lightly. There will be some spectral re-growth due to the second clip but it should be acceptable since the clip is light. This method allows the user to increase the peak-to-average ratio reduction at the expense of a slight degradation in adjacent channel power (ACP) at the power amplifiers respective inputs. However, if the power amplifier is operated at its rated power then it is likely that the non-linearities of the power amplifiers will produce adjacent channel splatter that exceeds that of there respective input signals. Therefore, the actual ACP performance seen at the antenna output may not be degraded at all by the inclusion of the second clipping function. On the contrary, the PAR reduction resulting from the second clipping function may result in an improved ACP at the antenna output even though the ACP at the power amplifier input is degraded.

Using the input to the first window clipper, the waveform designate 1, as the reference, one can see how the standard IS-95 channel filter with a 3 dB corner frequency of 590 KHz and 45 dB of attenuation has shaped the spectrum prior to any window clipping or further filtering. The PAR at 0.01% of the original signal is 9.75 dB. Clipping the signal, using clipping function 301, from a 0.01% PAR of 9.75 dB down to 4.57 dB results in a rise of the out-of-band energy as shown by the waveform designated 2. The clipped signal is then filtered with the resulting spectrum shown by the waveform designated 3. While the ACP is good after the filtering, the peak-to-average ratio has increased to 5.62 dB at 0.01%. Clipping the signal a second time brings the 0.01% PAR back down to 4.66 dB, but produces additional splatter as shown by the waveform designated 4. Note that the splatter is still lower than the original noise floor established by the channel filter.

Figure 6:
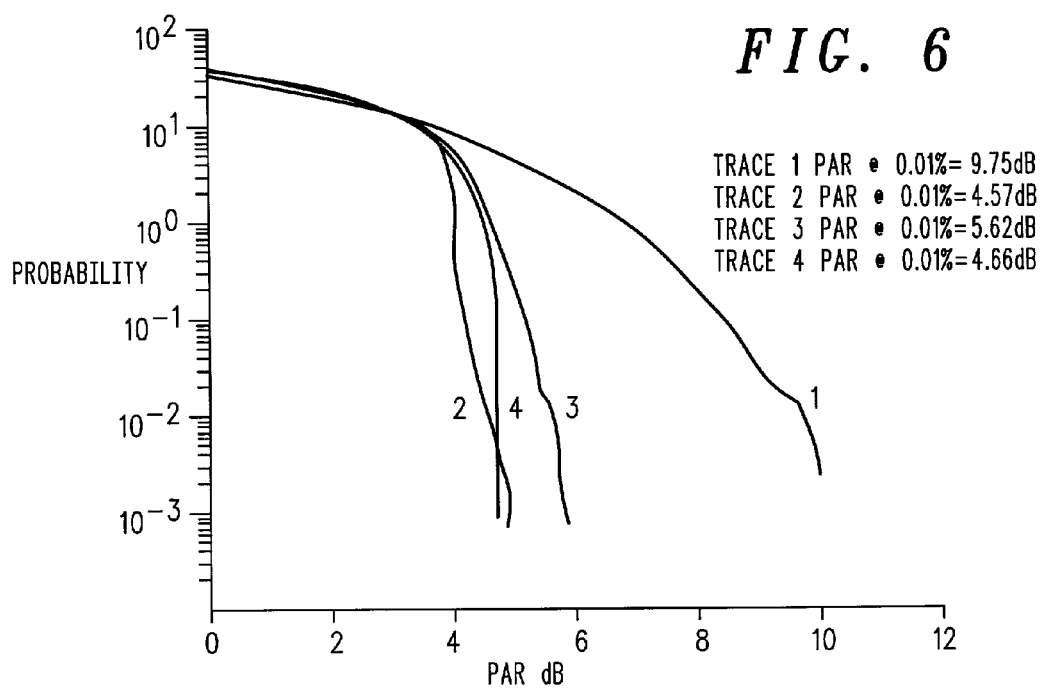

FIG. 6 shows how the peak-to-average ratio changes throughout the processing chain. See the Table below for a summary of various information relevant to the waveforms of FIG. 6. The changes in the peak-to-average ratio can be broken down into changes in the peak power and changes in average power, as shown in the table below. Using waveform 1 as the reference we can see that the clipping operation performed by clipping function 301 as depicted in waveform 2 greatly reduces the peak power of the signal while reducing the average power to a lesser extent. After the signal has been filtered, waveform 3, the average falls slightly due to attenuation in the pass band of the filter, but the peaks increase due to changes in the signal in the complex plane. In an attempt to regain some of the lost PAR reduction, the signal is clipped, albeit lightly, a second time. The result is another dB of reduction in the peak power while the average power remains relatively unchanged as shown in waveform 4.

|  | Point 1 | Point 2 | Point 3 | Point 4 |
| --- | --- | --- | --- | --- |
| Peak Power (dB) | 0 | −6.430 | −5.754 | −6.909 |
| Peak Power @ 0.01% (dB) | 0 | −6.435 | −5.655 | −6.629 |
| Avg Power (dB) | 0 | −1.255 | −1.525 | −1.539 |

Using the peak reduced waveforms as inputs to a power amplifier the following improvement were measured. At rated output power the clipped waveforms had 6 to 7 dB better ACP performance while maintaining the same efficiency as the non-clipped waveforms. Running the power amplifier an additional 3 dB over rated power with the clipped waveform as the input resulted in an ACP that was identical to the power amplifier running at rated power with the non-clipped waveforms. Driving the power amplifier 3 dB harder resulted in a 50% improvement in efficiency. These results are typical but may vary depending on how much the power amplifier is backed off.

As noted above the apparatus for processing base band signals includes the processing unit that further comprises, in one embodiment, a pre-distortion function or predistorter that pre-distorts each of the output signals according to a function that reduces the effects resulting from a non linearity of the multi-channel transmitter. In a simpler known embodiment, the predistortion algorithm is known and stored in memory for example during production of the amplifier. Such a system or pre distorter provides the least amount of correction, as it is not adaptive and is not able to account for changes in PA characteristics caused by temperature, time and load changes for example. A classic example is a static look-up-table. The look-up-table is a table of values representing the inverse of the PA's transfer function. In particular, for amplitude predistortion, it would be a table of output amplitudes along with the corresponding required input amplitudes. The desired output, which is based on the 'known input', would be 'looked-up' in the 'output amplitude' part of the table to yield the required 'predistorted input amplitude' from the 'input amplitude' part of the table. This provides a transfer from 'known input' to 'predistorted input amplitude'. A similar table would exist for the phase portion of predistortion. The look-up-table would be stored in memory at the factory or possibly loaded at the time the equipment is deployed. Such a predistortion function is well known.

In a more complex embodiment, the outputs of the PAs are available, through downconversion and feedback to the digital-signal-processing domain, to adapt the predistortion parameters. Such a system provides more correction than the non-adaptive system. Here, one would generate a model of the forward path based on the known base band input and the digitized version of the PA output. Then, an inverse to the forward model is generated, and this is the predistortion function. This inverse would be generated on a sample by sample basis. Such a system will track the variations in the PA's transfer function, thereby providing more correction. We have used a filtered tapped-delay-line (TDL) approach to model the forward path of the PA. This effort is explained in the following article: Sean McBeath, Danny Pinckley, and J. R. Cruz, "W-CDMA Power Amplifier Modeling," in *Proc. IEEE Veh. Technol. Conf.*, 2001, pp 2243–2247. The filtered TDL model represents the PA as a linear filter, followed by the tapped-delay-line model, followed by another linear filter. In short, the filtered TDL model is a highly accurate memory-based model of the PA. However, any model may be used here, with a popular choice being a simple polynomial model or a look-up-table. What is important is that the parameters are allowed to change. Complex memory based models allow for more correction of PA characteristics using predistortion.

Figure 7:
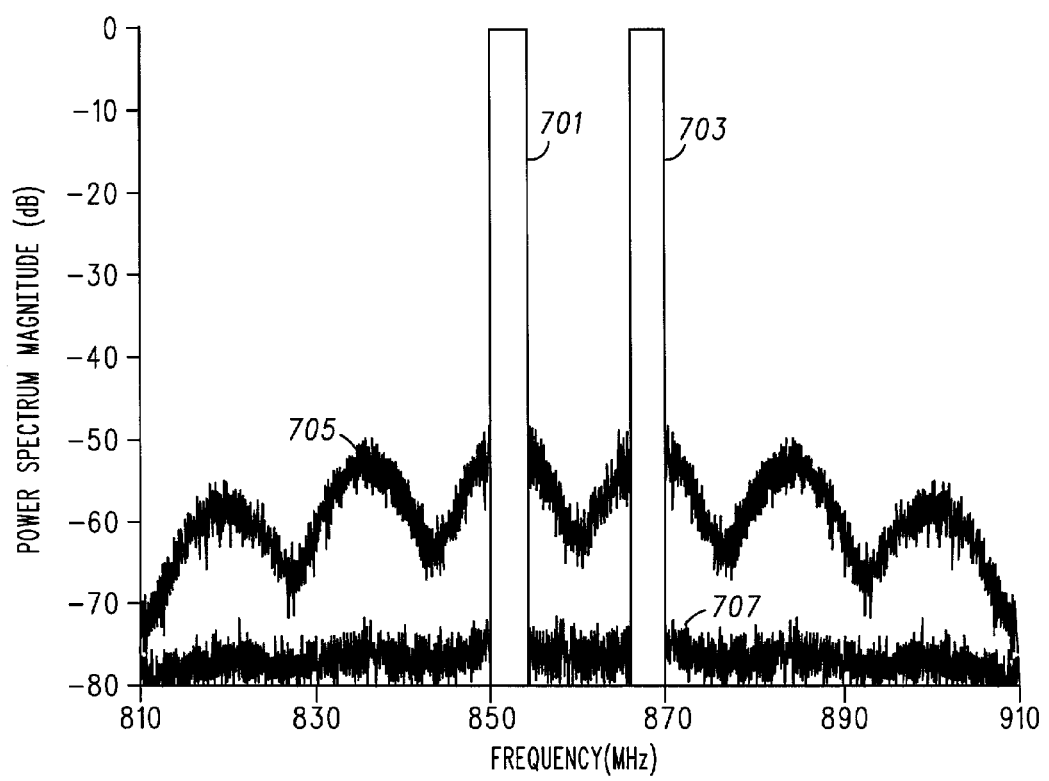
FIG. 7 depicts a graph of experimental results for an apparatus for processing base band signals for use in the FIG. 2 transmitter.

FIG. 7 shows a graph of the performance of the transmitter of FIG. 2 where the processing unit 205 performed predistortion according to a memoryless polynomial model. With the compensation function or matrix determined as discussed above, a two-carrier W-CDMA signal 701, 703 was passed through this predistortion function and through the compensation function 206. It was then passed through the second FTM 207, a filter to simulate the upconversion path, then the first RF FTM 211, the PA 213 simulated using a polynomial nonlinearity in amplitude with significant backoff, and finally the second RF FTM 215. The predistortion model or inverse PA characteristic was modeled as a $10^{th}$ order polynomial with po=10 in the equation below. The amplifier was represented as an $11^{th}$ order polynomial, with po=11 in the equation below. The polynomial is defined as follows:

$$\tilde{y}(n) = a_0 x^{po}(n) + a_1 x^{po-1}(n) + \ldots + a_{po-1} x(n) + a_{po},$$

In this simulation experiment, the PA had only amplitude compression, so no phase correction was needed. Therefore, only one polynomial was needed. The $10^{th}$ order polynomial was an approximation to the inverse of the $11^{th}$ order polynomial. The output of the second RF FTM should have all the benefits of predistortion. FIG. 7 demonstrates this by showing the output of the system with predistortion 707 and without predistortion 705. From FIG. 7, one can easily see the predistortion signal was correctly transmitted through the series of FTMs to achieve the desired results, which was intermodulation reduction, at the amplifier and thus the output. These relatively dramatic simulation results are in part due to the model used for the amplifier, which allowed for almost perfect correction. One may not realize as much improvement in real systems, however this is a good indication of what can be accomplished if the model for the amplifier and thus predistortion function is very accurate.

FIG. 8 depicts a block diagram of an alternative embodiment of the transmitter of FIG. 2. Items or blocks bearing reference numerals identical to FIG. 2 operate and represent identical items to those in FIG. 2 and will not be further discussed. The compensation function 806 is different and is coupled to the output base band signals from FTM 206 prior to the mixer 209 and is operable to apply gain compensation 809 and phase compensation 811 to each of the output base band signals, according to a feedback signal 826 from the DSP Controller 813, for variations in the plurality of paths within the multi-channel transmitter, the feed back signal originating from the multi-channel transmitter at the sampler 245. This approach would be very useful in systems with minimal frequency selectivity in the plurality of paths over the frequencies of interest, thus requiring minimal frequency selectivity correction. In this case, amplitude and phase correction can be used as the compensation function. Of course, the compensation function can be implemented on the input or output side of the second base band FTM 206.

As a summary and in the context of the methodology that we have discussed with reference to the apparatus figures the following description of a preferred method is provided. We have discussed and described a method of improving performance in a multi-channel transmitter that uses analog Transform Matrices such as Fourier Transform Matrices for power amplifier redundancy. The method includes providing a plurality of output signals each comprising a combination of phase shifted versions of one or more input signals; modifying according to a predetermined algorithm, preferably performing clipping, pre-distortion, or the like each of the output signals to provide a plurality of modified output signals; and then decomposing the modified output signals to provide one or more output base band signals, each of the output base band signals corresponding to one of the input signals. Further included in the method is a process of compensating, preferably according to a feedback signal, one of a group of signals comprised of either the plurality of modified output signals or the output base band signals, depending on where the compensating operation or process is undertaken in the method.

To use the above methodology in a transmitter the method further includes converting each of the output base band signals to a radio frequency signal to provide one or more radio frequency signals; generating a plurality of amplifier input signals, each comprising a combination of phase shifted versions of the radio frequency signals, where the amplifier input signals correspond to the modified output signals; amplifying the amplifier input signals to provide a plurality of amplified output signals using a power amplifier having a plurality of amplifiers, where each amplifier has an input coupled to one of the amplifier input signals and provides one of the amplified output signals; coupling a plurality of portions of one of the plurality of the amplifier input signals or the plurality of the amplified output signals, each portion representative of one of the one of the plurality of the amplifier input signals and the plurality of the amplified output signals, back to the compensation procedure, where the plurality of portions correspond to the feedback signal; and then decomposing the plurality of amplified output signals to provide one or more transmit signals corresponding one to one with the output base band signals.

Preferably the process of providing a plurality of output signals uses a first digital FTM and the decomposing the modified output signals uses a second digital FTM, where the first digital FTM is coupled to a plurality of input signals each comprising one of a code division, a time division, and a frequency division multiple access base band signal for transmission on a radio channel. The step of modifying according to the predetermined algorithm each of the output signals further comprises pre-distorting or clipping each of the output signals according to a predetermined function that either reduces the effects on the transmit signals resulting from a non linearity of each of the amplifiers or lowers the probability that a peak will exceed a predetermined value for each of the modified output signals. A further step of filtering, after the clipping, each of the output signals will reduce undesired signals resulting from the clipping.

The step or procedure of compensating in one aspect includes compensating the plurality of modified output signals, according to a feedback signal, for variations in a plurality of signal paths and processes between the modified output signals and the amplified output signals. In another aspect the step compensating further includes compensating the output base band signals, according to the feedback signal, for variations in a plurality of signal paths and processes between the output base band signals and the amplified output signals. Note that if the feedback signal is derived from the amplifier input signals, (sampling of the input amplifier signals is used) that the compensation or variable portion of the compensation, if any, can only account for variations in signal paths up to the point of sampling and that any further compensation such as for variations in signal paths through the amplifier would be open loop. In one form compensating includes compensating a gain and a phase of either the modified output signals or the output base band signals.

The methods and apparatus, discussed above, and the inventive principles and concepts thereof are intended to and will alleviate problems caused by prior art transmitters using TMs and conventional base band processing techniques. Using these principles of developing at base band, signals that are faithful representations of signals that power amplifiers will see at their input and processing those signals for lower or reduced peak to average ratios or for pre-distortion attributes has shown a dramatic improvement in transmitter performance.

Various embodiments of method and apparatus for modifying base band signals and compensating such signals so as to facilitate and provide for improved transmitter performance and reduced peak power requirements for the transmitters have been discussed and described. It is expected that these embodiments or others in accordance with the present invention will have application to many wide area networks. Using the inventive principles and concepts disclosed herein advantageously allows or provides for low cost high availability multi-channel transmitters that will be required for current and future communications systems and this will be beneficial to both users and providers of such systems.

This disclosure is intended to explain how to fashion and use various embodiments in accordance with the invention rather than to limit the true, intended, and fair scope and spirit thereof. The invention is defined solely by the appended claims, as may be amended during the pendency of this application for patent, and all equivalents thereof.

What is claimed is:

1. An apparatus for processing base band signals to provide low level signals for amplification that will improve performance of a multi-channel transmitter, the apparatus comprising in combination:
   a first Transform Matrix (TM) coupled to at least one input signals for providing a plurality of output signals each comprising a combination of phase shifted versions of said at least one input signals;
   a processing unit coupled to said output signals for modifying according to a predetermined algorithm each of said output signals to provide a plurality of modified output signals;
   a second TM coupled to said modified output signals for decomposing said modified output signals to provide at least one output base band signals, each of said output base band signals corresponding to one of said input signals; and
   a compensation function arranged and inter-coupled to one of said plurality of modified output signals and said output base band signals to compensate said one of said plurality of modified output signals and said output base band signals so that said output base band signals are suitable for generating the low level signals that will improve the performance of the multi-channel transmitter.

2. The apparatus for processing base band signals of claim 1 further substantially implemented in an integrated circuit form.

3. The apparatus for processing base band signals of claim 1 wherein said first TM and said second TM further comprise a first digital Fourier TM (FTM) and a second digital FTM, said first digital FTM coupled to a plurality of input signals that each comprise one of a code division, time division, and frequency division multiple access base band signal for transmission on a radio channel.

4. The apparatus for processing base band signals of claim 1 wherein said processing unit further comprises a clipping function that operates to limit peaks of said each of said output signals according to a predetermined function that lowers the probability that said peaks will exceed a predetermined value for said modified output signals.

5. The apparatus for processing base band signals of claim 4 wherein said processing unit further comprises a filter, coupled to said clipping function, to reduce undesired signals resulting from said clipping function.

6. The apparatus for processing base band signals of claim 4 wherein said compensation function is inter-coupled between said processing unit and said second TM and operating to compensate said plurality of said modified output signals, according to a feedback signal, for variations in a plurality of paths within the multi-channel transmitter, said feed back signal originating from the multi-channel transmitter.

7. The apparatus for processing base band signals of claim 4 wherein said compensation function is coupled to said output base band signals and operable to compensate said output base band signals, according to a feedback signal, for variations in a plurality of paths within the multi-channel transmitter, said feed back signal originating from the multi-channel transmitter.

8. The apparatus for processing base band signals of claim 1 wherein said processing unit further comprises a pre-distortion function that pre-distorts said each of said output signals according to a function that reduces the effects resulting from a non linearity of the multi-channel transmitter.

9. The apparatus for processing base band signals of claim 8 wherein said compensation function is inter-coupled between said processing unit and said second TM and operable to compensate said plurality of said modified output signals, according to a feedback signal, for variations in a plurality of paths within the multi-channel transmitter, said feed back signal originating from the multi-channel transmitter.

10. The apparatus for processing base band signals of claim 8 wherein said compensation function is coupled to said output base band signals and operable to compensate said output base band signals, according to a feedback signal, for variations in a plurality of paths within the multi-channel transmitter, said feed back signal originating from the multi-channel transmitter.

11. The apparatus for processing base band signals of claim 1 wherein said compensation function operates to apply gain and phase compensation to said one of said plurality of modified output signals and said output base band signals.

12. A multi-channel transmitter using analog Fourier Transform Matrices for power amplifier redundancy and having improved performance, the multi-channel transmitter comprising in combination:
an apparatus for processing base band signals further comprising: a first Fourier Transform Matrix (FTM) coupled to at least one input signals for providing a plurality of output signals each comprising a combination of phase shifted versions of said input signals; a processing unit coupled to said output signals for modifying according to a predetermined algorithm each of said output signals to provide a plurality of modified output signals; a second FTM coupled to said plurality of said modified output signals for decomposing said modified output signals to provide at least one output base band signals, each of said output base band signals corresponding to one of said input signals; and a compensation function arranged and inter-coupled to one of said plurality of modified output signals and said output base band signals to compensate according to a feedback signal said one of said plurality of modified output signals and said output base band signals;
a mixer for converting each of said output base band signals to a radio frequency signal to provide at least one radio frequency signals;
a first analog FTM for providing a plurality of amplifier input signals, each comprising a combination of phase shifted versions of said radio frequency signals;
a power amplifier having a plurality of amplifiers to provide a plurality of amplified output signals, each amplifier having an input coupled to one of said plurality of said amplifier input signals and providing one of said plurality of said amplified output signals;
a sampler for coupling a plurality of portions of one of said plurality of said amplifier input signals and said plurality of said amplified output signals, each representative of one of said one of said plurality of said amplifier input signals and said plurality of said amplified output signals, back to said compensation function, said plurality of portions corresponding to said feedback signal; and
a second analog FTM coupled to said plurality of amplified output signals to provide at least one transmit signals corresponding one to one with said output base band signals.

13. The multi-channel transmitter of claim 12 wherein said first FTM and said second FTM further comprise a first digital FTM and a second digital FTM, said first digital FTM coupled to a plurality of said input signals, each comprising one of a code division, a time division, and a frequency division multiple access base band signal for transmission on a radio channel.

14. The multi-channel transmitter of claim 12 wherein said processing unit further comprises a clipping function that operates to limit peaks of said each of said output signals according to a predetermined function that lowers the probability that said peaks will exceed a predetermined value for said each of said modified output signals.

15. The multi-channel transmitter of claim 14 wherein said processing unit further comprises a filter, coupled to said clipping function, to reduce undesired signals resulting from said clipping function.

16. The multi-channel transmitter of claim 14 wherein said compensation function is inter-coupled between said processing unit and said second FTM and operable to compensate said plurality of said modified output signals, according to said feedback signal, for variations in a plurality of paths between said compensation function and said sampler.

17. The multi-channel transmitter of claim 14 wherein said compensation function is coupled to said output base band signals prior to said mixer and operable to compensate said output base band signals, according to said feedback signal, for variations in a plurality of paths between said compensation function and said sampler.

18. The multi-channel transmitter of claim 12 wherein said processing unit further comprises a pre-distortion function that pre-distorts said each of said output signals according to a predetermined function that reduces the effects on said transmit signals resulting from a non linearity of said each of said amplifiers.

19. The multi-channel transmitter of claim 18 wherein said compensation function is inter-coupled between said processing unit and said second FTM and operable to compensate said plurality of said modified output signals according to said feedback signal for variations in a plurality of paths between said compensation function and said sampler.

20. The multi-channel transmitter of claim 18 wherein said compensation function is coupled to said output base band signals prior to said mixer and operable to compensate said output base band signals, according to said feedback signal, for variations in a plurality of paths between said compensation function and said sampler.

21. The multi-channel transmitter of claim 12 wherein said compensation function is operable to apply gain and phase compensation to said one of said plurality of modified output signals and said output base band signals.

22. A method of improving performance in a multi-channel transmitter using analog Fourier Transform Matrices for power amplifier redundancy, the method including the steps of:
provide a plurality of output signals each comprising a combination of phase shifted versions of at least one input signals;
modifying according to a predetermined algorithm each of said output signals to provide a plurality of modified output signals;
decomposing said modified output signals to provide at least one output base band signals, each of said output base band signals corresponding to one of said input signals;
compensating according to a feedback signal, one of said plurality of modified output signals and said output base band signals;
converting each of said output base band signals to a radio frequency signal to provide at least one radio frequency signals;
generating a plurality of amplifier input signals, each comprising a combination of phase shifted versions of said radio frequency signals, said amplifier input signals corresponding to said modified output signals;
amplifying said plurality of said amplifier input signals to provide a plurality of amplified output signals using a power amplifier having a plurality of amplifiers, each amplifier having an input coupled to one of said plurality of said amplifier input signals and providing one of said plurality of said amplified output signals;
coupling a plurality of portions of one of said plurality of said amplifier input signals and said plurality of said amplified output signals, each representative of one of said one of said plurality of said amplifier input signals and said plurality of said amplified output signals, back to said compensation function, said plurality of portions corresponding to said feedback signal; and
decomposing said plurality of said amplified output signals to provide at least one transmit signals corresponding one to one with said output base band signals.

23. The method of claim 22 wherein said providing a plurality of output signals uses a first digital FTM and said decomposing said modified output signals uses a second digital FTM, said first digital FTM coupled to a plurality of said input signals each comprising one of a code division, a time division, and a frequency division multiple access base band signal for transmission on a radio channel.

24. The method of claim 22 wherein said modifying according to said predetermined algorithm said each of said output signals further comprises clipping said each of said output signals according to a predetermined function that lowers the probability that a peak will exceed a predetermined value for said each of said modified output signals.

25. The method of claim 24 wherein said modifying according to said predetermined algorithm said each of said output signals further comprises filtering, after said clipping, said each of said output signals to reduce undesired signals resulting from said clipping.

26. The method of claim 24 wherein said compensating further includes compensating said plurality of said modified output signals, according to said feedback signal, for variations in a plurality of signal paths and processes between said modified output signals said amplified output signals.

27. The method of claim 24 wherein said compensating further includes compensating said output base band signals, according to said feedback signal, for variations in a plurality of signal paths and processes between said output base band signals and said amplified output signals.

28. The method of claim 22 wherein said modifying according to said predetermined algorithm said each of said output signals further comprises pre-distorting said each of said output signals according to a predetermined function that reduces the effects on said transmit signals resulting from a non linearity of said each of said amplifiers.

29. The method of claim 28 wherein said compensating further includes compensating said plurality of said modified output signals according to said feedback signal for variations in a plurality of signal paths and processes between said modified output signals and said amplified output signals.

30. The method of claim 28 wherein said compensating further includes compensating said output base band signals according to said feedback signal for variations in a plurality of signal paths and processes between said output base band signals and said amplified output signals.

31. The method of claim 22 wherein said compensating includes compensating a gain and a phase of said one of said plurality of modified output signals and said output base band signals.

32. An apparatus for processing base band signals to provide low level signals for amplification that will improve performance of a multi-channel transmitter, the apparatus comprising in combination:
a first Transform Matrix (TM) coupled to at least one input signals for providing a plurality of output signals each comprising a combination of phase shifted versions of said at least one input signals;
a processing unit coupled to said output signals for pre-distorting according to a predetermined algorithm each of said output signals to provide a plurality of pre-distorted output signals; and
a second TM coupled to said pre-distorted output signals for decomposing said pre-distorted output signals to provide at least one output base band signals, each of said output base band signals corresponding to one of said input signals and suitable for generating the low level signals that will improve the performance of the multi-channel transmitter.

33. The apparatus for processing base band signals of claim 32 wherein said processing unit is further operable for pre-distorting according to an adaptive algorithm each of said output signals to provide said plurality of pre-distorted output signals.

* * * * *